US012684704B2

(12) United States Patent
Iketani et al.

(10) Patent No.: US 12,684,704 B2
(45) Date of Patent: Jul. 14, 2026

(54) ULTRA THIN DIELECTRIC PRINTED CIRCUIT BOARDS WITH THIN LAMINATES AND METHOD OF MANUFACTURING THEREOF

(71) Applicant: Sanmina Corporation, San Jose, CA (US)

(72) Inventors: Shinichi Iketani, Sunnyvale, CA (US); Toshiya Suzuki, Sagamihara (JP)

(73) Assignee: Sanmina Corporation, San Jose, CA (US)

( * ) Notice: Subject to any disclaimer, the term of this patent is extended or adjusted under 35 U.S.C. 154(b) by 61 days.

(21) Appl. No.: 17/234,471

(22) Filed: Apr. 19, 2021

(65) Prior Publication Data

US 2021/0243903 A1     Aug. 5, 2021

Related U.S. Application Data

(62) Division of application No. 16/036,913, filed on Jul. 16, 2018, now Pat. No. 10,993,333.

(60) Provisional application No. 62/533,005, filed on Jul. 15, 2017.

(51) Int. Cl.
| | |
|---|---|
| *H05K 3/46* | (2006.01) |
| *H05K 1/11* | (2006.01) |
| *H05K 3/00* | (2006.01) |
| *H05K 3/02* | (2006.01) |

(52) U.S. Cl.
CPC ........... *H05K 3/4655* (2013.01); *H05K 1/119* (2013.01); *H05K 3/007* (2013.01); *H05K 3/0097* (2013.01); *H05K 3/4673* (2013.01);

*H05K 3/4682* (2013.01); *H05K 3/02* (2013.01); *H05K 3/4664* (2013.01); *H05K 2201/0191* (2013.01); *H05K 2203/013* (2013.01)

(58) Field of Classification Search
CPC .... H05K 3/4655; H05K 3/007; H05K 3/4673; H05K 3/0097; H05K 3/4682; H05K 3/02; H05K 1/119; H05K 2201/0191
See application file for complete search history.

(56) References Cited

U.S. PATENT DOCUMENTS

| | | | | |
|---|---|---|---|---|
| 4,306,925 A | * | 12/1981 | Lebow | H05K 3/4682 |
| | | | | 156/247 |
| 4,902,610 A | * | 2/1990 | Shipley | H05K 3/205 |
| | | | | 430/315 |
| 4,915,983 A | | 4/1990 | Lake et al. | |
| 5,707,749 A | * | 1/1998 | Katagiri | B32B 15/08 |
| | | | | 428/354 |

(Continued)

*Primary Examiner* — Jeffrey T Carley

(74) *Attorney, Agent, or Firm* — Tyler Barrett; LOZA & LOZA, LLP

(57) ABSTRACT

Ultra-thin dielectric printed circuit boards (PCBs) are provided. An ultra-thin dielectric layer may be coupled to a first conductive layer on a first side of the ultra-thin dielectric layer. A second conductive layer may be coupled to a second side of the ultra-thin dielectric layer, and the ultra-thin dielectric layer is thinner than at least one of the first conductive layer and the second conductive layer. The second conductive layer may be patterned to form electrical paths. The patterned second conductive layer may be filled with a dielectric filler. One or more conductive layers and one or more ultra-thin dielectric layers may also be coupled to the second conductive layer.

9 Claims, 4 Drawing Sheets

SINGLE-SIDED ULTRA-THIN DIELECTRIC LAYER
PRINTED CIRCUIT BOARD STRUCTURE

(56) References Cited

U.S. PATENT DOCUMENTS

| | | | | |
|---|---|---|---|---|
| 6,214,445 | B1 * | 4/2001 | Kanbe | H05K 1/162 |
| | | | | 257/E23.079 |
| 6,254,971 | B1 * | 7/2001 | Katayose | H01L 23/142 |
| | | | | 428/209 |
| 6,455,784 | B1 * | 9/2002 | Kinoshita | H05K 3/20 |
| | | | | 428/209 |
| 6,882,045 | B2 * | 4/2005 | Massingill | H10W 70/095 |
| | | | | 257/532 |
| 6,894,230 | B2 * | 5/2005 | Novak | H05K 1/162 |
| | | | | 257/E23.079 |
| 6,914,500 | B2 * | 7/2005 | Hirabayashi | H05K 1/16 |
| | | | | 333/204 |
| 7,800,916 | B2 * | 9/2010 | Blackwell | H01L 23/4985 |
| | | | | 361/792 |
| 8,181,342 | B2 | 5/2012 | Chiang et al. | |
| 10,257,921 | B1 * | 4/2019 | Roy | H05K 1/0245 |
| 10,511,073 | B2 * | 12/2019 | Miller | H01P 11/003 |
| 2001/0011606 | A1 * | 8/2001 | Bergstedt | H05K 1/162 |
| | | | | 174/260 |
| 2001/0055676 | A1 * | 12/2001 | Smith | B32B 7/12 |
| | | | | 428/461 |
| 2003/0213615 | A1 * | 11/2003 | Utsumi | H05K 3/4655 |
| | | | | 174/257 |
| 2004/0048420 | A1 * | 3/2004 | Miller | H01P 3/084 |
| | | | | 438/106 |
| 2004/0097078 | A1 * | 5/2004 | Danielson | H05K 3/4007 |
| | | | | 438/689 |
| 2006/0203456 | A1 * | 9/2006 | Sohn | H05K 3/4661 |
| | | | | 361/748 |
| 2007/0119619 | A1 | 5/2007 | Nakamura et al. | |
| 2008/0217049 | A1 * | 9/2008 | Dudnikov | H01G 4/30 |
| | | | | 977/948 |
| 2009/0321932 | A1 * | 12/2009 | Gonzalez | H01L 21/6835 |
| | | | | 257/E21.477 |
| 2010/0025093 | A1 | 2/2010 | Maruyama | |
| 2012/0038053 | A1 * | 2/2012 | Oh | H01L 21/561 |
| | | | | 257/773 |
| 2012/0111624 | A1 | 5/2012 | Maeda | |
| 2012/0162928 | A1 * | 6/2012 | Das | H01L 23/49833 |
| | | | | 361/728 |
| 2014/0027156 | A1 | 1/2014 | Kim et al. | |
| 2014/0209469 | A1 * | 7/2014 | Scott | H05K 3/0023 |
| | | | | 977/762 |
| 2014/0291866 | A1 * | 10/2014 | Ooi | H01L 23/498 |
| | | | | 438/106 |
| 2015/0340309 | A1 | 11/2015 | Furutani et al. | |
| 2018/0033762 | A1 * | 2/2018 | Gowda | H01L 24/19 |

* cited by examiner

*SINGLE-SIDED ULTRA-THIN DIELECTRIC LAYER PRINTED CIRCUIT BOARD STRUCTURE*

*DOUBLE-SIDED ULTRA-THIN DIELECTRIC LAYER PRINTED CIRCUIT BOARD STRUCTURE*

ULTRA THIN DIELECTRIC PRINTED CIRCUIT BOARDS WITH THIN LAMINATES AND METHOD OF MANUFACTURING THEREOF

CLAIM OF PRIORITY UNDER 35 U.S.C. § 119

The present Application for Patent is a divisional of, and claims priority to U.S. patent application Ser. No. 16/036, 913 filed Jul. 16, 2018 entitled "ULTRA THIN DIELEC-TRIC PRINTED CIRCUIT BOARDS WITH THIN LAMI-NATES AND METHOD OF MANUFACTURING THEREOF," to issue Apr. 27, 2021 as U.S. Pat. No. 10,993, 333 which claims priority to U.S. Provisional Application No. 62/533,005 filed Jul. 15, 2017 entitled "ULTRA THIN DIELECTRIC PRINTED CIRCUIT BOARDS WITH THIN LAMINATES AND METHOD OF MANUFACTUR-ING THEREOF," the entire disclosures of which are hereby expressly incorporated by reference herein.

FIELD

The present invention relates to printed circuit boards (PCBs), and more particularly, to methods of forming ultra-thin dielectric layers, especially thinner than adjacent con-ductor layer thickness, within a multi-layer PCB.

BACKGROUND

Consumers are increasingly demanding both faster, smaller, and lighter electronic products. The use of PCBs has grown enormously as new electronic applications are mar-keted. A PCB is formed by laminating a plurality of con-ducting layers with one or more non-conducting layers. While the size and/or thickness of a PCB may shrink, it may still need to provide electrical interconnections and integrate electrical characteristics (e.g., capacitive layers) to help support operations of ever complex and higher frequency circuits.

Thin dielectric printed circuit board (PCB) processes were developed as an advanced build up PCB process to achieve thin dielectric layer PCB compared to traditional laminate and dielectric prepreg formation structure. For instance, U.S. Publication No. 20140027156 (Kim et al) discloses a prior art method for manufacturing a thin dielectric multilayer printed circuit board in which a carrier substrate is used to form layers of the thin dielectric printed circuit board which, after removal from the carrier substrate, are then stacked/ laminated together. The dielectric layers are unhardened film (or uncured prepreg) that form the insulating layers. This approach makes it difficult to form electrical patterns on conductive layers prior to laminating, which may cause reliability problems and is also an obstacle in creating very thin PCBs.

U.S. Pat. No. 8,181,342 (Chiang et al) also discloses a method for forming a thin dielectric multilayer printed circuit board by building up a structure of dielectric layers and conductive layers on a carrier and then separating the built-up structure from the carrier. However, this approach does not provide a way for making the resulting built-up structure thinner than in the prior art.

Therefore, a method is needed to form thin dielectric layer printed circuit board structures.

DETAILED DESCRIPTION

Figure 1:
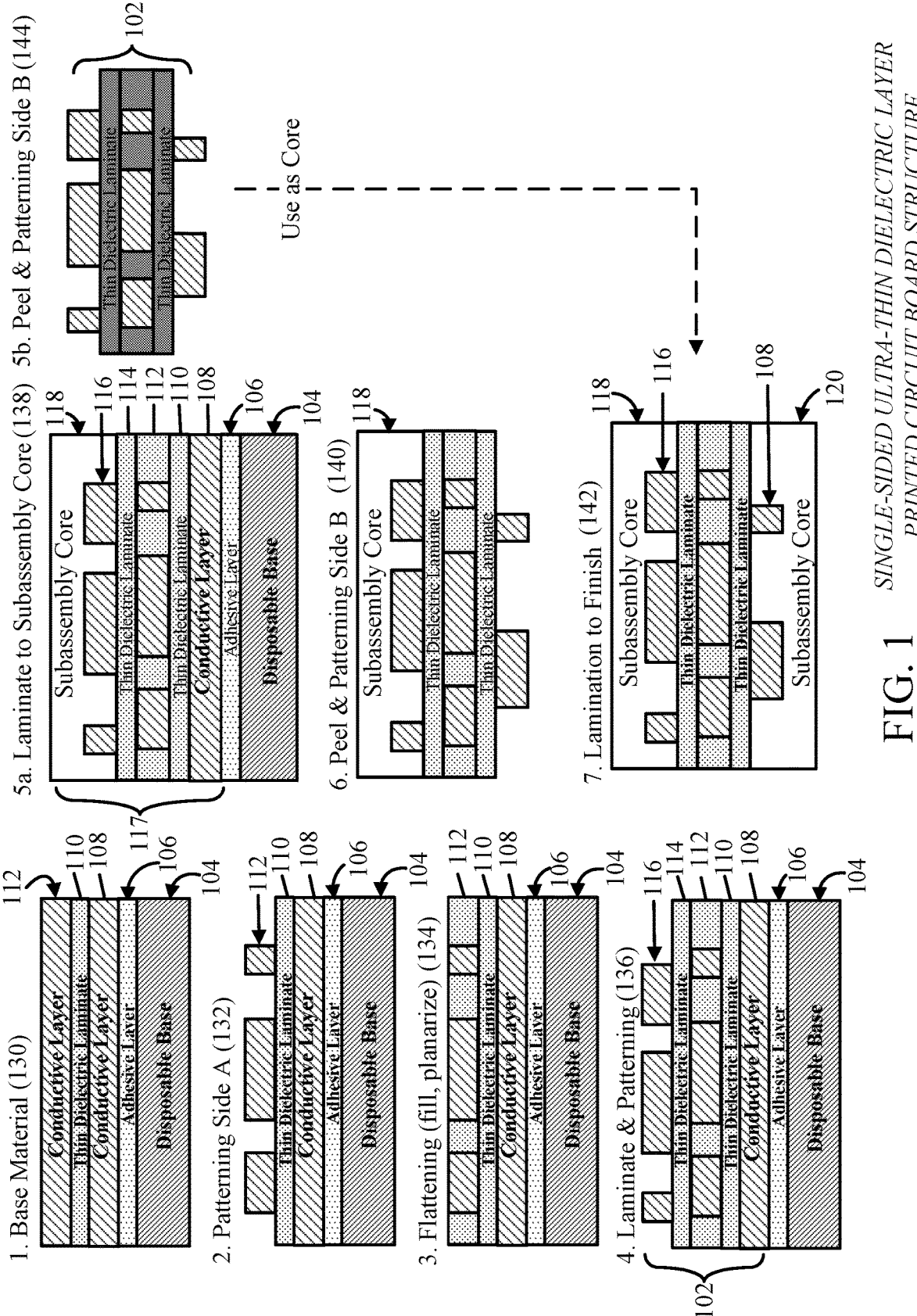
FIG. 1 illustrates a single-sided stack process for forming an ultra-thin dielectric layer printed circuit board structure.

FIG. 1 illustrates a single-sided stack process for forming an ultra-thin dielectric layer printed circuit board structure. A disposable base 104 may be used to support a build-up of conductive and dielectric layers that may be detachably coupled to the disposable base 104 by an adhesive layer 106, such as an adhesive film or an adhesive gel. At a first stage 130, a first conductive layer 108 (e.g., copper layer, etc.) is coupled to the adhesive layer 106. Alternatively, two con-ductive layers or foils (e.g., 108 and 112), which may include two copper foils/layers detachably coupled to an adhesive film or adhesive gel is laminated to the disposable base 104. A first ultra-thin dielectric laminate 110 may be coupled between the first conductive layer 108 and a second conductive layer 112. In a first example, the ultra-thin dielectric layer 110 may have a thickness of 50 micron or less while the first and second conductive layers 108 and 112 are each more than 50 micron thick. In a second example, the ultra-thin dielectric layer 110 may have a thickness of 20 micron or less while the first and second conductive layers 108 and 112 are each more than 20 micron thick. In a third example, the ultra-thin dielectric layer may have a thickness of 10 micron or less while the first and second conductive layers 108 and 112 are each more than 10 micron thick.

At a second stage 132, the exposed second conductive layer 112 may be patterned (e.g., by etching, etc.) to form electrical traces, pads and/or planes thereon. Note that, the individual conductive layers 108 and 112, or the combina-tion of the conductive layers 108 and 112 and ultra-thin dielectric laminate 110, may lack sufficient rigidity to per-form such patterning. Consequently, the disposable base 104 serves to provide such rigidity (e.g., to prevent the conduc-tive layers 108 and/or 112 and/or ultra-thin dielectric lami-nate 110 from flexing. This permits making the conductive layers 108 and/or 112 and/or ultra-thin dielectric laminate 110 thinner than when using conventional PCB building techniques.

At a third stage 134, a dielectric filler is used fill-in the gaps and/or voids formed by the patterning process on the second conductive layer 112. After curing the dielectric filler, the exposed surface of the second conductive layer 112 may then be flattened or planarized (e.g., by polishing, sanding, etc.) to thin and/or flatten the second conductive layer 112.

At a fourth stage 136, a second ultra-thin dielectric laminate 114 and third conductive layer 116 may be added to the planarized second conductive layer 112. The third conductive layer 116 may then be patterned to form elec-trical traces and/or pads. These third and fourth stages may be repeatedly conducted as necessary layers formation.

At a fifth stage 138, the exposed surface of the third conductive layer 116 may then be laminated to a first subassembly core 118. The first subassembly core 118 may be a previously fabricated stack of layers (e.g., a structure of conductive layers and dielectric layers).

At a sixth stage 140, the disposable base 104 and the adhesive layer 106 are removed or separated from the other layers 117, and the first conductive layer 108 may be patterned. At this point, the other layers 117 may have sufficient rigidity on which to form additional layers. This may permit, at a seventh stage 142, laminating a second subassembly core 120 to the now exposed surface of the first conductive layer 108. An exposed surface of the first conductive layer 108 may be patterned, e.g., at the sixth stage 140, prior to lamination to the second subassembly core 120.

In an alternative approach to the fifth stage 138, referred to as first alternative stage 144, the ultra-thin layers assembly 102 may be separated from the disposable base 104 and adhesive layer 106 before laminating any subassembly core 118. At this point, the ultra-thin layers assembly 102 may have sufficient rigidity on which to form additional layers. An exposed surface of the first conductive layer 108 may be patterned, and then subassembly cores 118 and/or 120 may be laminated on one more both sides of the ultra-thin dielectric assembly 102.

Note that while three conductive layers are illustrated in the ultra-thin layers assembly 102, additional conductive and/or dielectric layers may be coupled to the assembly 102 prior to separating from the disposable base 104. In some implementations, the thinner the conductive and dielectric layers in the ultra-thin layers assembly, the greater number of layers that are necessary to attain sufficient rigidity.

Figure 2A:
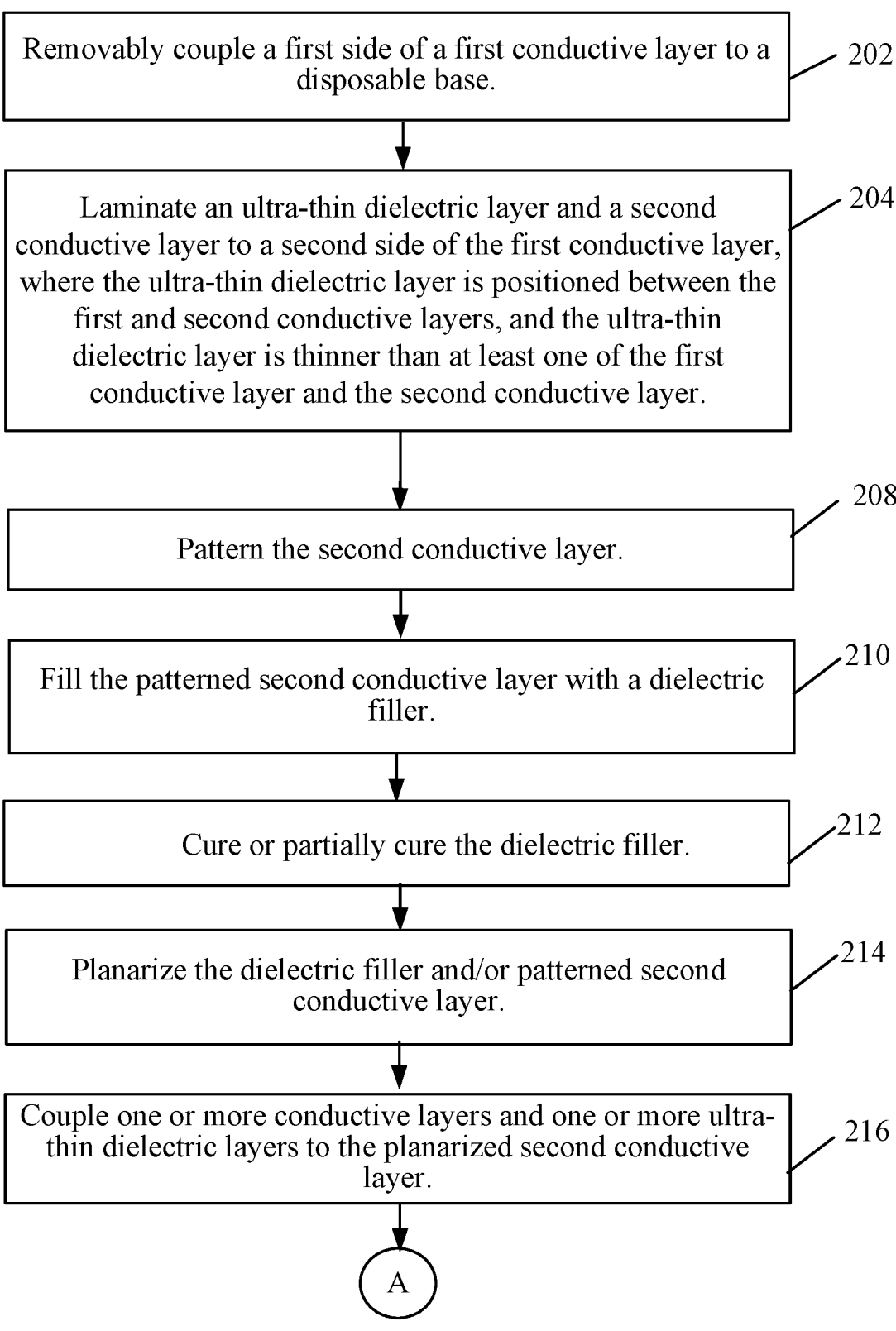
FIG. 2 (comprising FIGS. 2A and 2B) illustrates an exemplary method for forming an ultra thin dielectric printed circuit board structure.
Figure 2B:
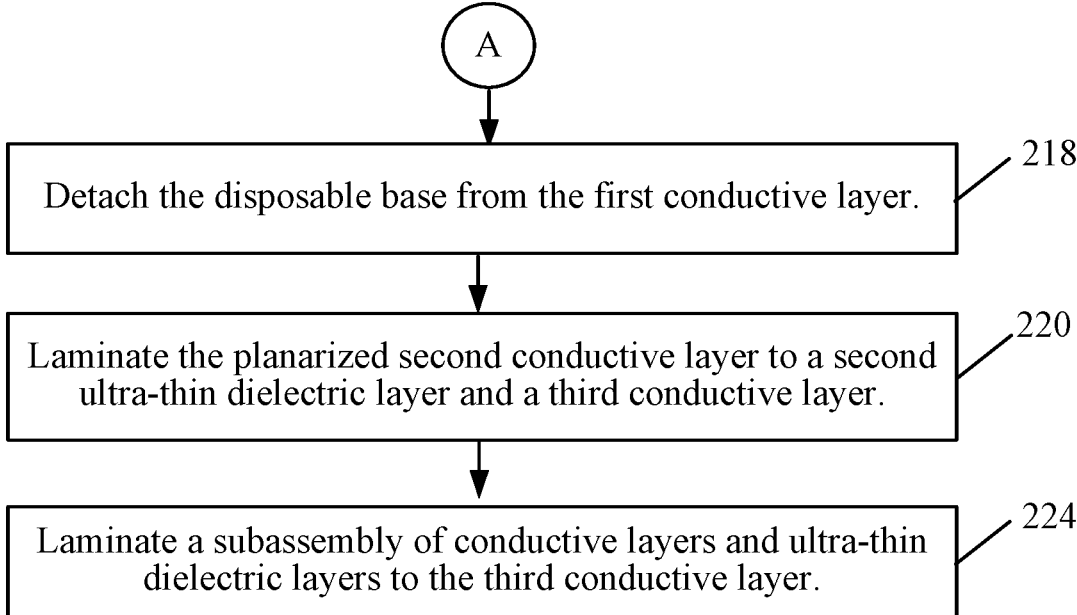

FIG. 2 (comprising FIGS. 2A and 2B) illustrates an exemplary method for forming an ultra-thin dielectric printed circuit board structure. A first side of a first conductive layer is removably coupling to a disposable base 202. An ultra-thin dielectric layer and a second conductive layer are then laminated to a second side of the first conductive layer, where the ultra-thin dielectric layer is positioned between the first and second conductive layers, and the ultra-thin dielectric layer is thinner than at least one of the first conductive layer and the second conductive layer 206. In another example, the ultra-thin dielectric layer is thinner than both the first conductive layer and the second conductive layer. The second conductive layer may then be patterned or etched to form electrical paths thereon 208.

The patterned second conductive layer may then be filled with a dielectric filler 210. The dielectric filler may then be cured or partially cured 212. According to some implementations, the filling may be done using an ink deposition method (e.g., using a dielectric on non-conductive ink). Various examples of such ink deposition method include screen printing, stencil printing, ink jet printing, ink dispensing, and spray coating. In screen printing, ink may be deposited over a pattern using a mesh/emulsion mask and then squeezing the ink. In stencil printing, ink may be deposited over a pattern using a cut hard mask and then squeezing the ink. In ink jet printing, the ink may be sprayed with a tiny nodule and the nodule is controlled position and spray timing. In ink dispensing, a relatively large nodule may dispense ink onto the board/substrate/conductive layer (e.g., the difference between ink jet and ink dispensing is only the size of the droplet and how to make the droplet). In spray coating, unlike ink jet, the ink droplet is not position controlled.

The dielectric filler and/or patterned second conductive layer are then planarized, flattened or polished 214. One or more conductive and dielectric layers may then be couple to the planarized second conductive layer 216. The disposable base is then detached from the first conductive layer 218. The planarized second conductive layer is then laminated with a second ultra-thin dielectric layer and a third conductive layer 220. A subassembly of conductive layers and dielectric layers are laminated to the third conductive layer 224.

In a first example, the ultra-thin dielectric layer may have a thickness of 50 micron or less while the first and second conductive layers are each more than 50 micron thick. In a second example, the ultra-thin dielectric layer may have a thickness of 20 micron or less while the first and second conductive layers are each more than 20 micron thick. In a third example, the ultra-thin dielectric layer may have a thickness of 10 micron or less while the first and second conductive layers are each more than 10 micron thick.

In some instances, the first and second conductive layers may each have a thickness of 3 micron, 5 micron, 9 micron, 12 micron, 0.5 ounce copper, 1 ounce copper, or 2 ounce copper. The dielectric layer between the conductive layers may have a thickness equal to or less than the first and second conductive layers.

Figure 3:
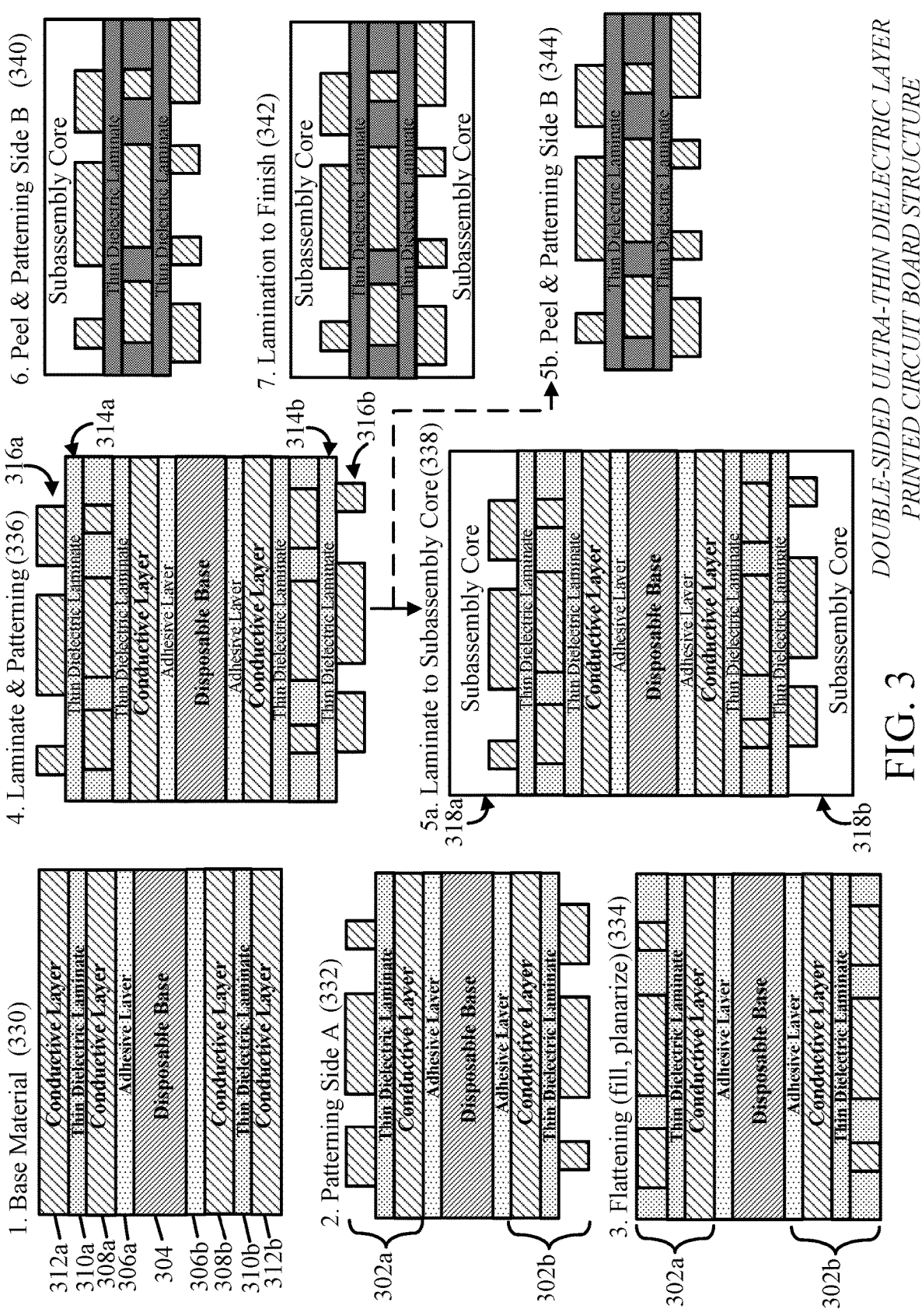
FIG. 3 illustrates a double-sided stack process for forming an ultra-thin dielectric layer printed circuit board structure.

FIG. 3 illustrates a double-sided process for forming an ultra-thin dielectric printed circuit board structure. This process is similar to that illustrated in FIG. 1 but lamination is performed on both sides of the disposable base at the same time. This approach may help produce ultra-thin layer assemblies more quickly.

A disposable base 304 may be used to support a first build-up of a conductive and dielectric layers that may be detachably coupled to the disposable base 304 by two adhesive layers 306a and 306b, such as an adhesive film or an adhesive gel.

At a first stage 330, a first conductive layer 308a is coupled to a first adhesive layer 306a. Alternatively, two conductive layers (308a and 312a), which may include two copper foils detachably coupled to an adhesive film or adhesive gel, is laminated to the disposable base 304. Similarly, a second conductive layer 308b is coupled to a second adhesive layer 306b. Alternatively, two conductive layers (308b and 312b), which may include two copper foils detachably coupled to an adhesive film or adhesive gel is laminated to base 304. A first ultra-thin dielectric laminate 310a is coupled to the first conductive layer 308a and a third conductive layer 312a. Similarly, a second ultra-thin dielectric laminate 310b is coupled to the second conductive layer 308b and a fourth conductive layer 312b.

At a second stage 332, the exposed third conductive layer 312a and/or exposed fourth third conductive layer 312b may be patterned (e.g., by etching, etc.) to form electrical traces and/or pads.

At a third stage 334, a dielectric filler is used fill-in the gaps and/or voids formed by the patterning process on the third and/or fourth conductive layers 312a and 312b. After curing the dielectric filler, the exposed surface of the third and fourth conductive layers 312a and 312b may then be planarized (e.g., by polishing, sanding, etc.) to thin and/or flatten the third and/or fourth conductive layers 312a and 312b.

At a fourth stage 336, a third ultra-thin dielectric laminate 314a and fifth conductive layer 316a may be added to the planarized third conductive layer 312a. Similarly, a fourth ultra-thin dielectric laminate 314b and sixth conductive layer 316b may be added to the planarized fourth conductive layer 312b. The fifth and sixth conductive layers 316a and 316b may then be patterned to form electrical traces and/or pads.

At a fifth stage 338, the exposed surface fifth copper layer 316a may then be laminated to a first subassembly core 318a (e.g., a previously fabricated layers of conductive layers and dielectric layers, or additional conductive and/or dielectric layers built-upon on the third copper layer). Similarly, the exposed surface sixth copper layer 316b may then be laminated to a second subassembly core 318b. The third stage to fifth stage may be performed multiple times, until the desired layers are constructed.

At a sixth stage 340, the disposable base 304 and adhesive layers 306a and 306b are removed. This permits, at a seventh stage 342, laminating a second subassembly core 318a/318b to the now exposed surface of the first copper layer 308a/308b. An exposed surface of the first copper layer 308a/308b may be patterned prior to lamination to a sub-assembly.

In an alternative approach to the fifth stage 344, the ultra-thin layers assembly 302a/302b may be separated from the disposable base 304 and adhesive layer 306a/306b before laminating any subassembly core. An exposed surface of the first copper layer 308 may be patterned, and then subassembly cores 318a/318b may be laminated on one or both sides of the ultra-thin dielectric assembly 302a/302b.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

The invention claimed is:

1. An ultra-thin dielectric printed circuit board (PCB), comprising:

a first conductive layer comprising a first side and a second side opposite the first side, the first conductive layer detachably coupled on the first side to a dispos-able base by an adhesive layer between and in direct contact with the first side of the first conductive layer and the disposable base, the adhesive layer facilitating detachment of the disposable base by peeling the disposable base from the first conductive layer;

a patterned second conductive layer comprising a first side and a second side opposite the first side;

a first ultra-thin dielectric layer coupled to the second side of the first conductive layer and to the first side of the second conductive layer, where the first ultra-thin dielectric layer is positioned between and in direct contact with the second side of the first conductive layer and the first side of the second conductive layer across the entirety of second side of the first conductive layer and the entirety of the first side of the second conductive layer, and a portion of the first ultra-thin dielectric layer that is positioned between the second side of the first conductive layer and the first side of the second conductive layer is thinner than the first con-ductive layer between the first side and the second side of the first conductive layer and thinner than the second conductive layer between the first side and the second side of the second conductive layer;

a dielectric filler filling the patterned second conductive layer;

a third conductive layer comprising a first side and a second side opposite the first side, the third conductive layer detachably coupled on the first side to the disposable base on a side of the disposable base opposite from the first conductive layer, the third conductive layer coupled to the disposable base by another adhe-sive layer between and in direct contact with the first side of the third conductive layer and the disposable base, the other adhesive layer facilitating detachment of the disposable base by peeling the disposable base from the third conductive layer;

a patterned fourth conductive layer comprising a first side and a second side opposite the first side; and a second ultra-thin dielectric layer coupled to the second side of the third conductive layer and to the first side of the fourth conductive layer, where the second ultra-thin dielectric layer is positioned between and in direct contact with the second side of the third conductive layer and the first side of the fourth conductive layer across the entirety of second side of the third conduc-tive layer and the entirety of the first side of the fourth conductive layer.

2. The ultra-thin dielectric printed circuit board of claim 1, further comprising:

at least one additional conductive layer and at least one additional ultra-thin dielectric layer coupled to the second conductive layer.

3. The ultra-thin dielectric printed circuit board of claim 2, wherein at least one ultra-thin dielectric layer is thinner than at least one adjacent conductive layer.

4. The ultra-thin dielectric printed circuit board of claim 2, wherein each ultra-thin dielectric layer is thinner than at least one adjacent conductive layer.

5. The ultra-thin dielectric printed circuit board of claim 1, wherein the ultra-thin dielectric layer has a thickness of 50 micron or less while the first and second conductive layers are each more than 50 micron thick.

6. The ultra-thin dielectric printed circuit board of claim 1, wherein the ultra-thin dielectric layer has thickness of 20 micron or less while the first and second conductive layers are each more than 20 micron thick.

7. The ultra-thin dielectric printed circuit board of claim 1, wherein the ultra-thin dielectric layer has thickness of 10 micron or less while the first and second conductive layers are each more than 10 micron thick.

8. The ultra-thin dielectric printed circuit board of claim 1, wherein the first and second conductive layers each have a thickness of 3 micron, 5 micron, 9 micron, 12 micron, 0.5 ounce copper, 1 ounce copper, or 2 ounce copper.

9. The ultra-thin dielectric printed circuit board of claim 1, wherein the first conductive layer is patterned, and the first conductive layer, the first ultra-thin dielectric layer, and the second conductive layer comprise at least a portion of a first subassembly structure, and further comprising:

a patterned outer conductive layer coupled to the first subassembly structure, opposite the first conductive layer, to form a first subassembly core.

* * * * *